(12) United States Patent
Jolly

(10) Patent No.: US 6,310,409 B1
(45) Date of Patent: Oct. 30, 2001

(54) OPTICALLY PROGRAMMABLE ARBITRARY TEMPORAL PROFILE ELECTRIC GENERATOR

(75) Inventor: Alain Jolly, Andernos (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/402,313

(22) PCT Filed: Apr. 1, 1998

(86) PCT No.: PCT/FR98/00660

§ 371 Date: Nov. 3, 1999

§ 102(e) Date: Nov. 3, 1999

(87) PCT Pub. No.: WO98/45945

PCT Pub. Date: Oct. 15, 1998

(30) Foreign Application Priority Data

Apr. 4, 1997 (FR) .................................................. 97 04140

(51) Int. Cl.[7] .................................................... H03K 5/01
(52) U.S. Cl. .............................. 307/106; 327/570; 372/25
(58) Field of Search .......................... 307/106; 327/570; 372/6, 25, 38

(56) References Cited

U.S. PATENT DOCUMENTS 4,482,816   11/1984   Richardson et al. .
4,670,662   6/1987    Goldstein et al. .
5,789,994 * 8/1998    Case et al. .............................. 333/20
5,987,045 * 11/1999   Albares et al. ......................... 372/38

OTHER PUBLICATIONS

Burkhart, S.C., et al., "National Ignition Facility Front End Laser System", *Solid State Lasers for Application to Inertial Confinement Fusion Conference*, proceedings, p. 48, Monterey, California, May 31–Jun. 2, 1995.
Burkhart, S.C., et al., "Temporal Pulse Shaping of Fiber Optic Laser Beams", *Inertial Confinement Fusion*, ICF Quarterly Report, Jan.–Mar. 1996, vol. 6, No. 2.
Hourmand, Y., "Driver/Source/Time Shaping", Technical note DRIF/DCRE 443/96 Jul. 2, 1996.

* cited by examiner

Primary Examiner—Stephen W. Jackson
Assistant Examiner—Robert L. Deberadinis
(74) Attorney, Agent, or Firm—Burns, Doane, Swecker & Mathis LLP

(57) ABSTRACT

The present invention relates to an optically programmable electric generator of arbitrary time profiles, which comprises a first ultrahigh frequency triggering line (10) and a second ultrahigh frequency discharge line (12) resistively coupled, by points, the first line being triggered by a voltage transition of duration less than one nanosecond, at least one point being taken off from the first line (10) by at least one photoconductor in variable resistance mode, directly coupled to the second line, illuminated by a programmable light source (13). A resistive load is connected at the output (S) of this generator.

8 Claims, 3 Drawing Sheets

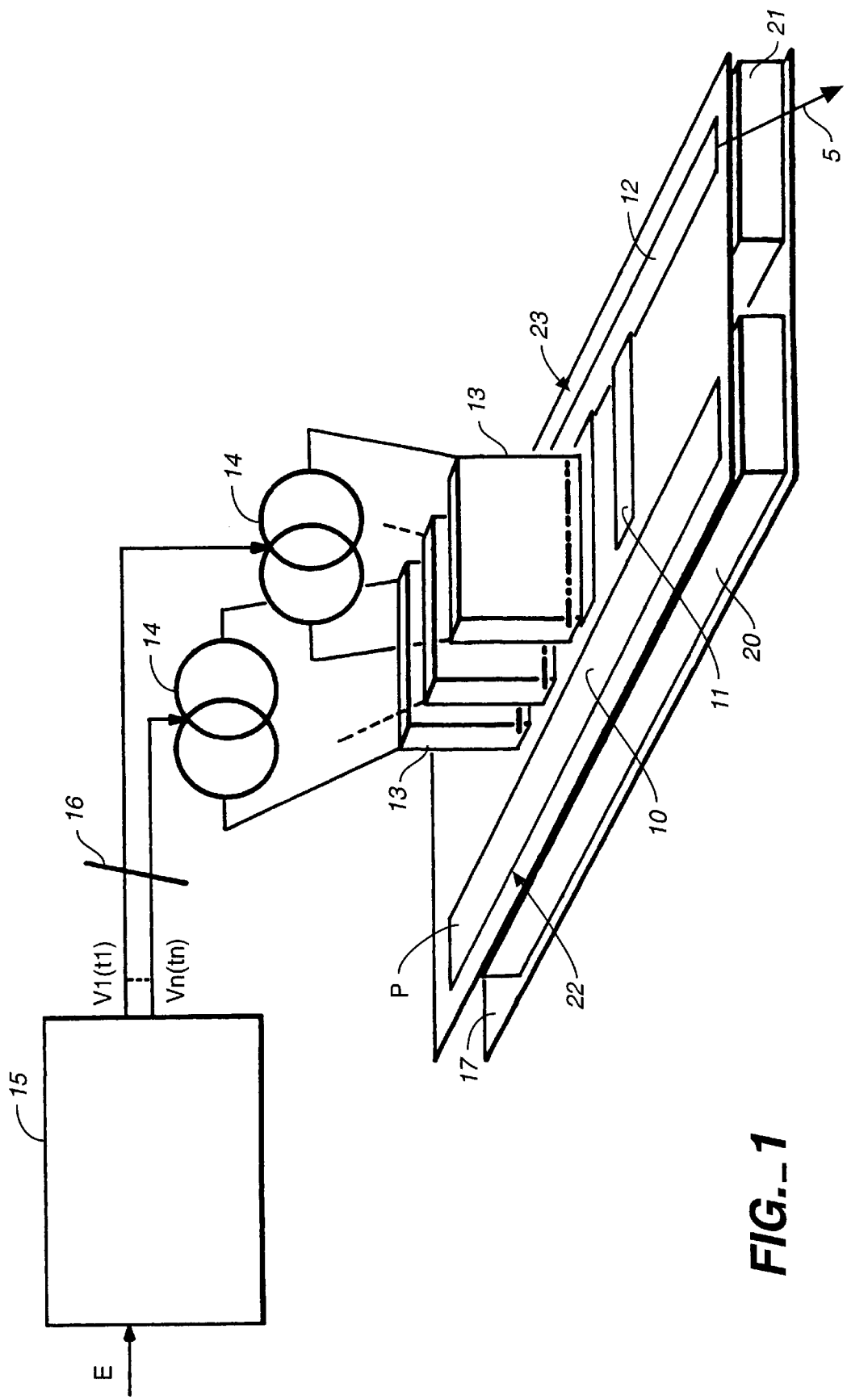
FIG._1

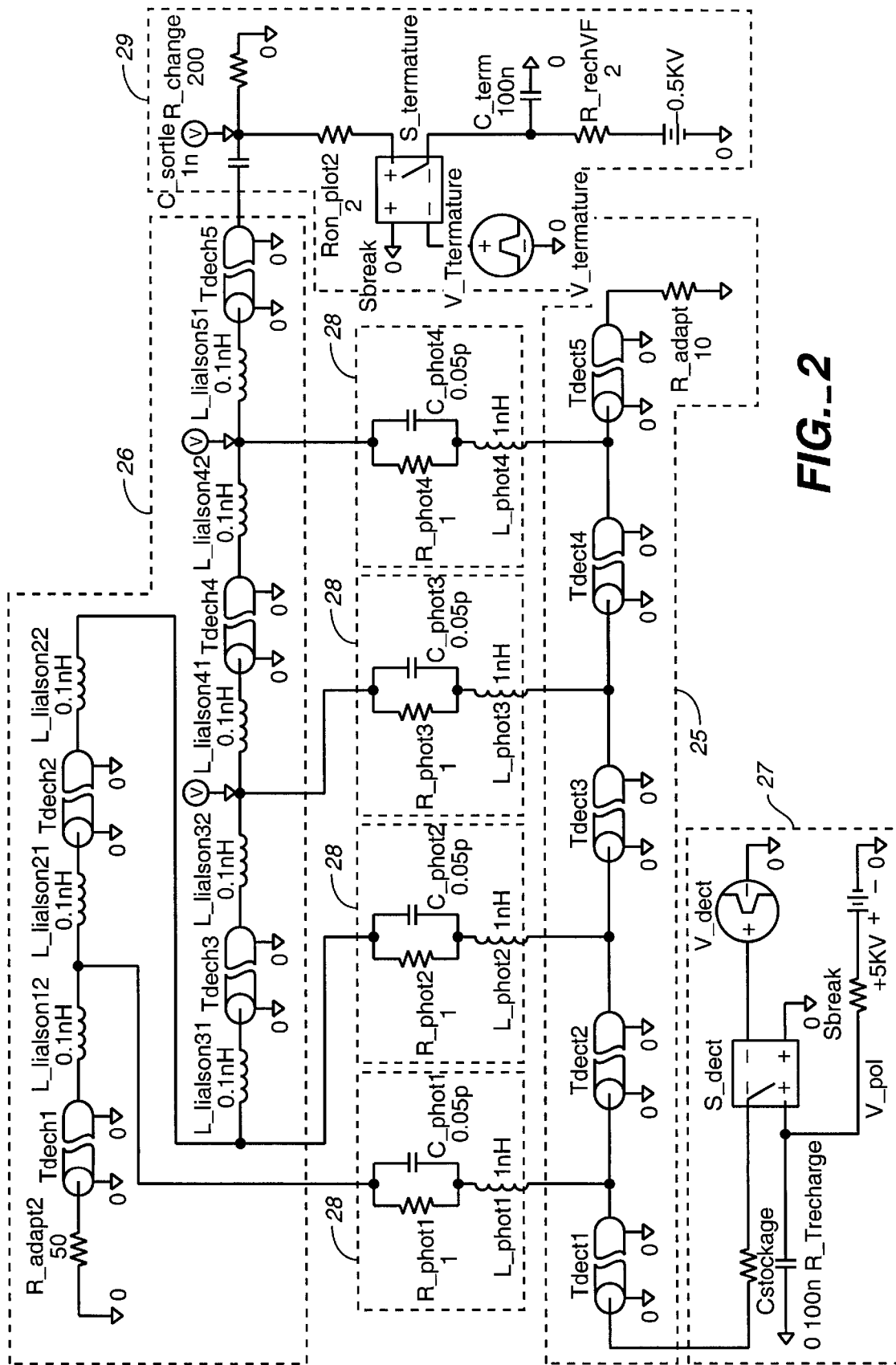
*FIG._2*

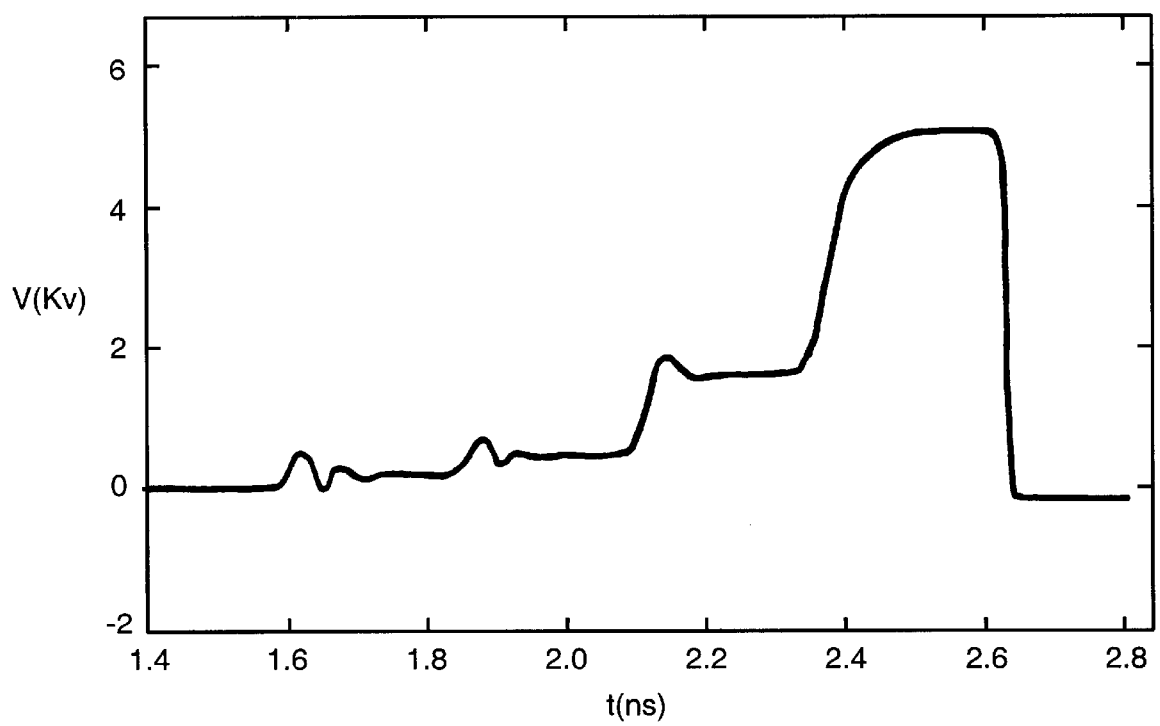
FIG._3
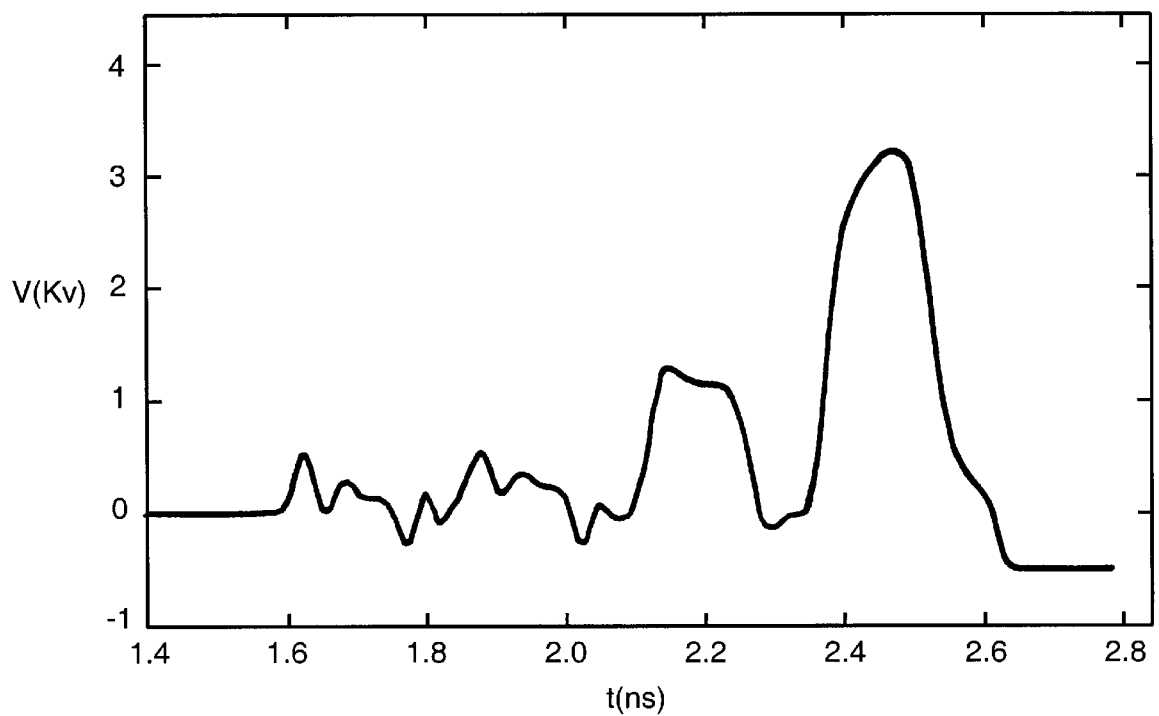
FIG._4

OPTICALLY PROGRAMMABLE ARBITRARY TEMPORAL PROFILE ELECTRIC GENERATOR

TECHNICAL FIELD

The present invention relates to an optically programmable electric generator of arbitrary time profiles.

PRIOR ART

The documents "The National Ignition Facility Front End Laser System" by S. C. Burkhart, et al., *Proceeding of the First Annual International Conference on Solid State Lasers for Application to Inertial Confinement Fusion Conference*, pp. 48–58, SPIE Vol. 2623, April 1995; "Temporal Pulse Shaping of Fiber Optic Laser Beams" by S. C. Burkhart, et al., *Inertial Confinement Fusion*, pp 75–81, ICF Quarterly Report, Vol. 6, No. 2, February 1996; and "Driver/Source/Time Shaping" by Y. Hourmand, *Technical note DRIF/DCRE* 443/96 dated Jul. 2, 1996, describe a pulse-forming device controlled by a computer using GaAs field-effect transistors, but these devices are limited frequency-wise and voltage-wise.

DESCRIPTION OF THE INVENTION

The present invention relates to an optically programmable electric generator of arbitrary time profiles, characterised in that it comprises a first ultrahigh frequency triggering line and a second ultrahigh frequency discharge line resistively coupled, by points, in that the first line is triggered by a voltage transition of duration less than one nanosecond, for example a pulse or a step, in that at least one point is taken off from the first line by at least one photoconductor in static resistance mode, directly coupled to the second line, illuminated by a programmable light source, a resistive load being connected at the output of this generator.

Advantageously a capacitor can optionally be disposed between each photoconductor and the second line making it possible to provide D.C. isolation of the first line from the second. The photoconductors are made of semiconductor materials taken from among the following materials: silicon, gallium arsenide. Each programmable light source can be an ultraviolet/visible/infrared gas tube, or a laser or light emitting semiconductor diode.

Advantageously each light source can be supplied by an independent current source controlled voltage-wise, the input signal of this current source being delivered by a programmable multi-way voltage generator driven by a computer.

Advantageously each programmable light source produces a variable illumination, programmed with reference to a set point, which defines the value of the resistance of the photoconductor, to which it is coupled, at the instant the generator is triggered.

Advantageously the two lines are straight strip lines made from metallic deposits on two substrates respectively associated with two dielectrics of different dielectric constants. The two ultrahigh frequency lines each have a characteristic resistance of between 10 Ω and 100 Ω, the substrate having a loss tangent tg $\delta \approx 10^{-3}$ at 10 GHz. The triggering of the first line can be an electrical or photoelectrical triggering, of indexed or pulsed type. A filter can be disposed between the output and the load, which makes it possible to smooth the time profile obtained.

Advantageously the programming step is between thirty picoseconds and one nanosecond. It is defined by the spacing between two photoresistances.

Such an electric generator of time profiles, preprogrammed by photoconductors, which is triggered by another generator, allows the time shaping (TS) of short pulses. Depending on the size of the time slot in which the profile must be programmed, and the triggering generator available, the step $\Delta t$ can vary between a few tens and a few hundreds of picoseconds.

In an advantageous use, this generator can be coupled to an electro-optical crystal using the Pockels effect to implement a laser pulse amplitude modulator.

Compared with the devices of the prior art, the generator of the invention has many original characteristics, and notably the following:

The coupling by photoconductors in optically preprogrammed resistance mode, and therefore the time shaping generator function, is programmable electronically.

The time shaping principle is based on an electrical circuit for programming by components preprogrammed in "quasi-static" mode, as opposed, for example, to the devices described in (1) "National Ignition Facility Front End Laser System" by S. C. Burkhart, R. J. Beach, J. H. Crane, J. M. Davin, M. D. Perny, and R. B. Wilcox, *Solid State Lasers for Application to Inertial Confinement Fusion Conference*, proceedings, page 48, Monterey, Calif., May 31–Jun. 2, 1995; (2) "Temporal Pulse Shaping of Fiber Optic Laser Beams" by S. C. Burkhart and F. A. Penko, *Inertial Confinement Fusion*, ICF Quarterly Report, Jan. –Mar. 1996, Vol. 6, No. 2; and (3) "Driver/Source/Time Shaping" by Y. Hourmand, *Technical note DRIF/DCRE* 443/96 dated Jul. 2, 1996, using components switched under dynamic conditions.

There are no high-speed active components, apart from triggering, of the GaAs field-effect transistor switch type, as in (1) "National Ignition Facility Front End Laser System" by S. C. Burkhart, R. J. Beach, J. H. Crane, J. M. Davin, M. D. Perny, and R. B. Wilcox, *Solid State Lasers for Application to Inertial Confinement Fusion Conference*, proceedings, page 48, Monterey, Calif., May 31–Jun. 2, 1995; (2) "Temporal Pulse Shaping of Fiber Optic Laser Beams" by S. C. Burkhart and F. A. Penko, *Inertial Confinement Fusion*, ICF Quarterly Report, Jan. –Mar. 1996, Vol. 6, No. 2; and (3) "Driver/Source/Time Shaping" by Y. Hourmand, *Technical note DRIF/DCRE* 443/96 dated Jul. 2, 1996, for example. In such a case, the high-frequency behaviour is limited by the speed of the field-effect transistors.

In the generator of the invention, the high-frequency limitation is due solely to the triggering generator and the losses in the lines.

It is possible to obtain a very large dynamic range in the programming of the photoconductors Rj in resistance mode, the photoconductors being illuminated in quasi-continuous mode. The limit on the dynamic range is due to the "signal/noise" ratio on the preprogrammed value Rj, and therefore the dark current of the photoconductor and the noise of the illumination source. This ratio, which can exceed 30 dB, is a function of the photoconductor implementation conditions.

There is no jitter of the time steps with respect to the triggering transition, by comparison with devices not using a single triggering source.

The invention is simple and versatile from an electronic and optoelectronic point of view. It is of low cost, if the laser diode optical programming sources (at present still expensive) are replaced by gas tubes. It has a small volume with regard to integrability, compared with solutions using discrete electrical components, for ultrahigh frequencies, of the variable attenuator type.

The use of photoconductors under quasi-static conditions, for making the time shaping generator programmable, makes it possible to combine all the advantages for a better "high voltage/large dynamic range/high frequency" compromise. With triggering using a photoconductor, the shaping of electrical or optical pulses (via an electro-optical modulator) can be performed with the following characteristics:

time step between 30 and 100 picoseconds;

voltage levels exceeding 5 kVolts;

programming dynamic range between 10 and 30 dB minimum.

One of the immediate applications of the generator of the invention is that of allowing the time shaping of an optical pulse provided by a laser, by chopping by means of an electro-optical modulator according to a predefined profile at the instant of the arrival of the triggering pulse.

A large number of other applications can be envisaged, as soon as it is necessary to provide, at a resistive load, a voltage profile falling within a previously defined time template, and within a range of levels which can extend from a few volts to a number of kilovolts.

BRIEF DESCRIPTION OF THE DRAWINGS

FIG. 1 illustrates an embodiment of the electric generator according to the invention;

FIG. 2 illustrates an example circuit for the design of the electric generator according to the invention;

FIGS. 3 and 4 illustrate two signal shapes obtained at the output of the electric generator according to the invention; FIG. 3 depicting triggering by a step and FIG. 4, triggering by a short pulse.

DETAILED DESCRIPTION OF EMBODIMENTS

The programmable generator of the invention is based on an assembly of two resistively coupled ultrahigh frequency lines 10, 12, incorporating photoconductors 11 programmable electronically by laser diodes 13 (or other gas and solid optical sources) and triggered by a high-speed switch placed at P which provides a very short voltage transition, typically of a few tens to a few hundreds of picoseconds. This switch makes it possible to trigger the generator, by electrical or electro-optical means (a photoconductor type switch).

As illustrated in FIG. 1, this generator comprises a first line 10 (the triggering line) triggered by means of a pulse (Dirac) or a short transition (step) of voltage (P being the triggering point), which allows propagation of this signal at constant speed.

A number of points, equidistributed or not, are defined on this first line 10, and coupled to as many photoconductors in resistance mode 11, directly or through a capacitor, on a second line 12. The function of these capacitors is to provide DC isolation of the first line from the second, which makes it possible to limit the consumption of the generator. The choice of using, or not, a connecting capacitor is also related to possible constraints on the dimensioning of the photoconductors 11 depending on their bias state. The second line 12 (the discharge line) is coupled to the first only by means of these photoconductors. The distributed stray couplings are limited as much as possible by controlling the geometry, the dimensions and the distribution of the earths of the assembly. The coupling photoconductors 11 are programmable, which makes it possible to obtain a generator of electrical profiles programmable voltage-wise. The photoconductors in variable resistance mode are made based on semiconductor materials of silicon (Si), gallium arsenide (GaAs) or some other type, illuminated by an assembly of programmable light sources which can be:

an assembly of "ultraviolet/visible/infrared" gas tubes;

an assembly of light emitting semiconductor diodes (LEDs) or laser diodes (LDs).

FIG. 1 depicts laser diodes 13 which are supplied by independent current sources 14 controlled voltage-wise. The input signals V1(t1), Vn(tn) of these current sources are delivered by a programmable multi-way control generator 15 via a control bus 16, this generator being driven by a signal E originating from a computer.

Each of the light sources 13 produces a variable illumination, programmed with reference to a set point, which defines the value of the resistance of the photoconductor to which it is coupled at the instant the generator is triggered.

The lines 10 and 12 are "strip" type lines made from metallic deposits on dielectric substrates 22, 23. These substrates 22, 23 have low losses, in order to be able to pass 3 to 10 GHz, and have a loss tangent tg$\delta \approx 10^{-3}$ at these frequencies. The basic parameters of each of the two lines 10 and 12 are the characteristic impedance and the distance separating two neighbouring photoconductors 11, and therefore the time step.

In the case of a high-voltage configuration, the nature and thickness of the dielectric are chosen in order to meet the voltage performance criteria.

The two lines 10 and 12 do not operate with the same time step and the difference in the two steps is exploited to define the shaping.

In operation, the first line 10 propagates the triggering transition, which defines an elementary time step between photoconductors, and induces a current transition $\Delta I = \Delta V/R$, R being the value of resistance, this transition being propagated and back-propagated in the second line 12.

As illustrated in FIG. 1, two straight strip lines 10 and 12 are used, associated with two dielectrics 20 and 21 of different permittivities ($\in$). A ratio of 4 in the values of $\in$ makes it possible to obtain a ratio of 2 in the propagation speeds, that is a ratio of 2 in the time steps if the photoconductors are set out as illustrated in the figure. This solution is simple from a technological point of view. It suffices to control the characteristic resistances by means of the widths of the two linear strips. These characteristic resistances can vary typically, for conventional dielectrics, from a few ohms to 200 ohms.

In the generator of the invention, each line has a characteristic resistance of between 10 $\Omega$ and 100 $\Omega$, these two lines being able to have identical or different characteristic resistances. The choice of these characteristic resistances has an influence on the generator optimization criteria: electrical efficiency, high-voltage performance, and triggering source characteristics.

In this embodiment, the time step is between thirty picoseconds and one nanosecond.

The photoconductors (Rj) are very slightly capacitive, which allows the generator to operate at high frequencies. For a time step equal to 100 psec on the triggering line and a range of values Rj=1 to 200 ohms for example, the capacitance associated with Rj must not exceed Cj=0.2 pF. A photoconductor geometry in the form of a long bar is therefore used, uniformly illuminated over its length (Dj) and in its volume. For Dj=1 cm, a width of 1 to 3 mm, and an Si or GaAs type photoconductor material, Cj does not exceed a few tens of fF.

Under steady state conditions there are no high frequencies, as far as the constraints due to the photoresistances are concerned.

If the case of high-voltage triggering by photoconductor, coupled to an energy storage line, is considered, a transition of 5 kV with a rise time less than 100 psec can thus be applied at the input of the triggering line 10.

The generator of the invention is preprogrammed at the instant of triggering, i.e. when the triggering transition is sent on the first line 10, at P.

There can be electrical or photoelectrical triggering of the first line 10: in the latter case, a photoconductor illuminated by a laser is used. Different types of indexed or pulsed triggering can be used.

The output (S) of the generator of the invention is connected to a resistive load: this can be an electric generator operating on a resistive load or an electro-optical modulator.

A filtering element can be placed between the output and the load, which makes it possible to smooth the time profile obtained. Smoothing can also be obtained by increasing the value of the rise time of the transition at P.

FIG. 2 illustrates an example circuit for the design of the generator according to the invention. There is a four-point operation based on photoconductors preadjusted in quasi-static mode, with a triggering line 25 with a constant 10 ohm impedance, a discharge line 26 with a constant 50 ohm impedance, a circuit 27 for triggering by GaAs serial photoconductor, RC networks 28 representing the equivalent circuit of the quasi-continuous photoconductor (QCW) and an electro-optical modulator 29 (with, in this precise case, compensation for the mechanical effects in the modulator).

The line elements "Ttrigger" and "Tdischg" represent the sections of strip line between which the resistive coupling points are installed.

These couplings are carried out with no capacitive connection. The elements "R_phot", "C_phot" and "L_phot" represent respectively a programmed photoresistance, and an associated stray capacitance and self-inductance, these stray elements being minimized as much as possible. The switches "S_trigger" and "S_turnoff", controlled by the voltage generators "V_trigger" and "V_Tturnoff", are a simplified representation of the injection generator, and of the turn-off switch which determines the shaping time slot. "S_trigger" can in particular be a photoconductor to which is coupled a laser providing short pulses (of the order of 10 to 30 picoseconds). The capacitor "Cstorage" is necessary from an electronic point of view for storing the energy before the instant of triggering ("serial" type triggering).

This example embodiment assumes the generator coupled to a travelling wave electro-optical modulator represented simply by a load resistor "R_load". The voltage source "V_turnoff", which is non-zero, has the function of compensating for the mechanical (and other) effects induced in the modulator crystal by the highvoltage transitions. Thus, it is possible to control the contrast when the system is turned off, after the rear transition of the time slot "T". The simulations are performed in the two extreme cases where the following are used as the triggering signal:

a step, with a photoconductor for which the life of the charge carriers is large compared with "T" as illustrated in FIG. 3;

a short Dirac type pulse, with a photoconductor for which this same life is short or of the same order of magnitude as T, as illustrated in FIG. 4.

What is claimed is:

1. An optically programmable electric generator of arbitrary time profiles, characterised in that it comprises a first ultrahigh frequency triggering line (10) and a second ultrahigh frequency discharge line (12) resistively coupled, by points; in that the first line is triggered by a voltage transition of duration less than one nanosecond; in that at least one point is taken off from the first line by at least one photoconductor (11) in variable resistance mode, directly coupled to the second line, illuminated by a programmable light source (13), a resistive load being connected at the output (S1, S2) of this generator.

2. A generator according to claim 1, in which a capacitor is disposed between each photoconductor (11) and the second line (12) making it possible to provide D.C. isolation of the first line (10) from the second (12).

3. A generator according to claim 1, in which the photoconductors (11) are made of semiconductor materials taken from among the following materials: silicon, gallium arsenide.

4. A generator according to claim 1, in which each programmable light source (13) is a gas tube.

5. A generator according to claim 1, in which each programmable light source (13) is a laser or light emitting semiconductor diode.

6. A generator according to claim 5, in which each programmable light source (13) is supplied by an independent current source (14) controlled voltage B wise, the input signal (V1(t1), Vn(tn)) of this current source being delivered by a programmable multi-way voltage generator (15) driven by a computer.

7. A generator according to claim 1, in which each programmable light source produces a variable illumination, programmed with reference to a set point, which defines the value of the resistance of the photoconductor, to which it is coupled, at the instant the generator is triggered.

8. A generator according to claim 1, in which the ultrahigh frequency lines (10, 12) are straight strip type lines made from metallic deposits on two substrates (22, 23) of different dielectric constants ($\in$).

* * * * *